United States Patent
Lee (10) Patent No.: US 8,780,663 B2
(45) Date of Patent: Jul. 15, 2014

(54) METHOD AND APPARATUS FOR REDUCING CURRENT CONSUMPTION BY MEMORY REFRESH OPERATION CONTROL

(71) Applicant: Samsung Electronics Co. Ltd., Suwon-si (KR)

(72) Inventor: Changheun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

(21) Appl. No.: 13/709,336

(22) Filed: Dec. 10, 2012

(65) Prior Publication Data

US 2013/0176804 A1   Jul. 11, 2013

(30) Foreign Application Priority Data

Jan. 5, 2012   (KR) .......................... 10-2012-0001351

(51) Int. Cl.
*G11C 7/00*   (2006.01)

(52) U.S. Cl.
USPC .......................................... 365/222; 365/227

(58) Field of Classification Search
CPC ................. G11C 11/40622; G11C 2211/4067; G11C 2207/2227
USPC ..................................... 365/222, 227
See application file for complete search history.

(56) References Cited

U.S. PATENT DOCUMENTS

| 6,738,861 B2 * | 5/2004 | Lawrence ................. 711/106 |
| 2008/0094931 A1 * | 4/2008 | Pyo et al. ................. 365/222 |

* cited by examiner

*Primary Examiner* — Anthan Tran
(74) *Attorney, Agent, or Firm* — Jefferson IP Law, LLP (57) ABSTRACT

A method and apparatus for reducing current consumption by employing a memory refresh operation is provided. The method employs a refresh operation in an apparatus including a memory in which a partial refresh operation is performed. The method includes classifying data loaded in the memory into first data and second data, dividing the memory into a first area and a second area when an attempt to access the first data is not detected during a preset time, separately arranging the first data and the second data in the first area and the second area, respectively, performing a refresh operation in the second area at a preset time in order to retain data, and loading the first data into the memory when the attempt to access the first data is detected.

20 Claims, 7 Drawing Sheets

METHOD AND APPARATUS FOR REDUCING CURRENT CONSUMPTION BY MEMORY REFRESH OPERATION CONTROL

PRIORITY

This application claims the benefit under 35 U.S.C. §119 (a) of a Korean patent application filed on Jan. 5, 2012 in the Korean Intellectual Property Office and assigned Serial No. 10-2012-0001351, the entire disclosure of which is hereby incorporated by reference.

BACKGROUND OF THE INVENTION

1. Field of the Invention

The present invention relates to a method and apparatus for reducing current consumption by a memory refresh operation. More particularly, the present invention relates to a method for controlling a refresh operation by classifying loaded data into data based on its retention characteristic (or "on its need for retention").

2. Description of the Related Art

Dynamic Random Access Memory (DRAM) stores data by storing charge in a cell capacitor. To retain the data by the DRAM, the charge stored in the cell capacitor is continuously maintained. As time goes by, the charge stored in the cell capacitor is reduced due to leakage of current. If the stored charge is reduced, a voltage across the cell capacitor is reduced to less than a predefined level. Accordingly, data loss may occur. Therefore, the DRAM needs a refresh operation for a cell capacitor in which a charge is stored at predefined times to retain data.

The refresh operation is periodically performed. Considerable current consumption is needed for the periodic refresh operation. Such excessive consumption of electric current reduces the useful lifetime of a battery, which in turn causes inconvenience for users of devices including DRAM. Therefore, a need exists for a method and an apparatus which reduce current consumed by a DRAM refresh operation.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address the above-mentioned problems and/or disadvantages and to provide at least the advantages described below. Accordingly, an aspect of the present invention is to provide an apparatus and a method for controlling a refresh operation by classifying loaded data into data to be continuously maintained and data that is not to be retained according to their respective characteristics. Thereafter, the data is separately arranged, based on the classification of the data, in different memory areas when an attempt to access first data is not detected. Then, a refresh operation is performed in an area of memory in which the data is to be continuously maintained in order to maintain the data, and the data to be continuously maintained into memory is loaded when the attempt to access the first data is detected.

In accordance with an aspect of the present invention, a method for reducing current consumption by employing a memory refresh operation in an apparatus that includes a memory in which a partial refresh operation is performed is provided. The method includes classifying data loaded in the memory into first data and second data, dividing the memory into a first area and a second area when an attempt to access the first data is not detected during a preset time, separately arranging the first data and the second data in the first area and the second area, respectively, performing a refresh operation in the second area at the preset time in order to retain data, and loading the first data into the memory when the attempt to access the first data is detected.

In accordance with another aspect of the present invention, an apparatus for reducing current consumption is provided. The apparatus includes a non-volatile storage medium that does not require a refresh operation, a memory in which the refresh operation is partially performed, a power unit for supplying power to the memory, a controller for classifying data loaded in the memory into first data and second data, dividing the memory into a first area and a second area when an attempt to access the first data is not detected during a preset time, and controlling such that the first data and the second data are separately arranged in the first area and the second area, respectively, a refresh operation controller for controlling such that a refresh operation in the second area is performed to retain data, and a data loader for loading the first data stored in the non-volatile storage medium into the memory when the controller detects the attempt to access the first data.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following detailed description in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It is to be understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "unchangeable data" refers to data not to be changed during execution of an application program. Code data and dedicated read data are each a type of unchangeable data. The code data are data for executing a program, and the dedicated read data are data which can be read and whose contents cannot be changed.

As used herein, the term "variable data" refers to data which are changed according to execution of an application program. Read/write data and 0-initialized data are each a type of variable data. The read/write data are data which are read and whose contents are changed. The 0-initialized data are data whose value is initialized to 0 during execution of a program.

As used herein, the term "idle state" refers to a state that does not supply power, or supplies only minimum power to, a peripheral device in order to reduce current consumption when an apparatus including a memory is in an idle state.

Figure 1:
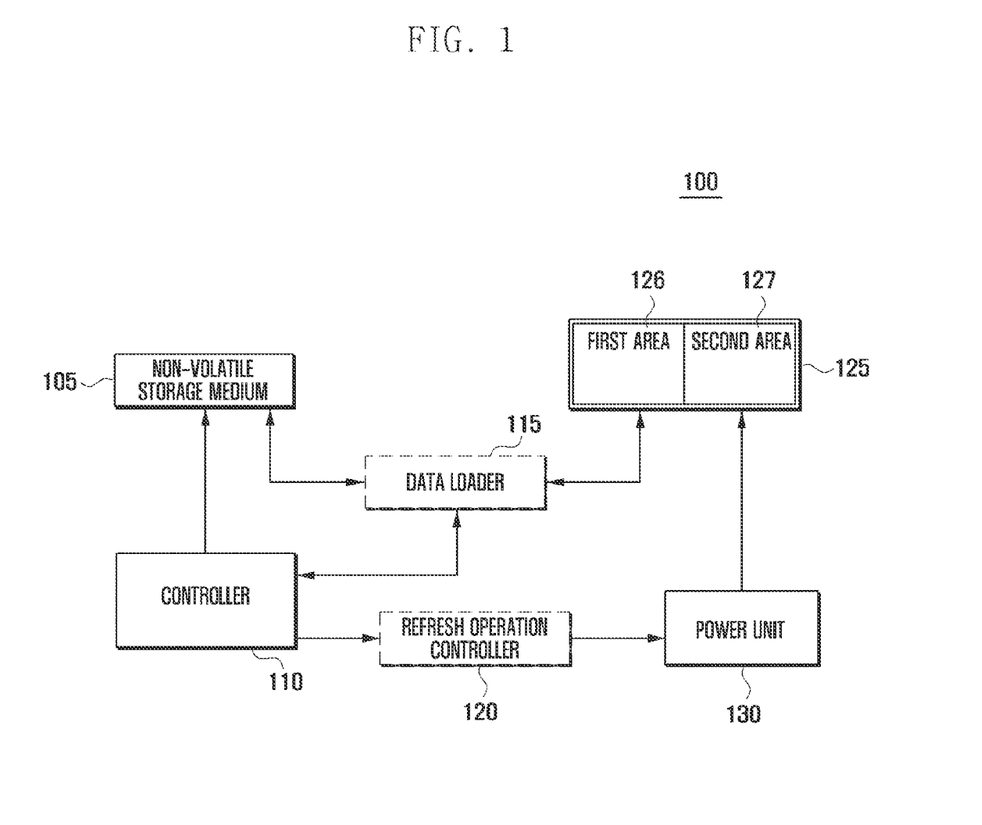
FIG. 1 is a block diagram illustrating an internal configuration of an apparatus according to an exemplary embodiment of the present invention.

FIG. 1 is a block diagram illustrating an internal configuration of an apparatus according to an exemplary embodiment of the present invention.

Referring to FIG. 1, the apparatus includes a non-volatile storage medium 105, a controller 110, a data loader 115, a refresh operation controller 120, a memory 125, and a power unit 130.

The non-volatile storage medium 105 functions to store data necessary for an operation of the apparatus 100, and may be divided into a program area and a data area. Because the non-volatile storage medium 105 can retain inputted information even when not powered, a refresh operation is not required. The non-volatile storage medium 105 includes a hard disk, a flash memory, an Electrically Erasable Programmable Read Only Memory (EEPROM), and the like.

In exemplary embodiments of the present invention, both variable data and unchangeable data may be stored in the non-volatile storage medium 150. The non-volatile storage medium 105 may transmit stored data to the data loader 115.

The data loader 115 functions to receive the data from the non-volatile storage medium 105 and to load the received data to the memory 125. Referring to FIG. 1, although the data loader 115 is shown as a separate block, it may be included inside the controller 110 at need.

The refresh operation controller 120 controls the power unit 130 to supply power to the memory 125 for each time set such that the memory 125 refreshes. Referring to FIG. 1, although the refresh operation controller 120 is shown as a separate block, it may be included inside the controller 110 at need.

The memory 125 functions to temporarily load an application program, and to temporarily store data. The memory 125 of the present invention refers to a Random Access Memory ('RAM'). RAM is a type of volatile memory. Because the RAM loses its data at power-off, a continuous power supply is required. In particular, a Dynamic Random Access Memory (DRAM) needs to be continuously refreshed in order to retain data. The memory 125 of the present invention is DRAM.

The memory 125 according to exemplary embodiments of the present invention may be divided into a first area 126 and a second area 127. A refresh operation may be performed in only a partial area. Further, the memory 125 may receive and load the data from the data loader 115.

The power unit 130 functions to supply power to the apparatus 100. When a time for the memory 125 to refresh occurs, the power unit 130 may supply power to the memory 125 under control of the controller 120. The power unit 130 may supply power to the entire memory 125, or to a partial area, of the memory 125.

The controller 110 controls operations and signal flows between internal blocks of the apparatus 100.

In exemplary embodiments of the present invention, if data is loaded into the memory 125 during an operation of the apparatus 100, the controller 110 may classify the data loaded in the memory 125 into either first data or second data. In such a case, the first data may be unchangeable data whose data value is not changed during execution of an application program. The second data may be variable data whose data value is changed during the execution of an application program.

Additionally, there may be code data or dedicated read data as the type of unchangeable data. Code data are, for example, data for executing a program, whereas the dedicated read data may be, for example, data which can be read and whose contents are not changed. Read/write data or 0-initialized data are each a type of variable data. The read/write data are data which can be read and whose contents can be changed. The 0-initialized data are data whose value is initialized to 0 during execution of a program.

Next, when an attempt to access the first data is not detected during a preset time, the controller 110 may divide the memory 125 into a first area 126 and a second area 127, and may separately arrange first data and second data in the first area 126 and the second area 127, respectively. The preset time may be optionally set by an apparatus user (e.g., several seconds or one minute).

If a time set such that the memory 125 refresh occurs, the controller 110 may control the refresh controller 120 to perform a refresh operation in the second area 127 of the memory 125 but not in the first area 126, thereby retaining the second data stored in the second area 127. In such a case, because a refresh operation on the first area 126 of the memory 125 is not achieved, the first data stored in the first area 126 may be lost.

When an attempt to access first data is made after the refresh operation in the second area 127 is performed, the controller 110 controls the data loader 115 to load the first data stored in the non-volatile storage medium 105 in the memory 125.

As described previously, because the refresh operation of the memory 125 is performed in only the second area 127, the current consumption is reduced as compared with a case in which a refresh operation is performed in all the areas of the memory 125. Accordingly, the life of the battery may be increased. Moreover, when the first data is accessed, because the first data are loaded from the non-volatile storage medium 105, data loss may be addressed.

In another exemplary embodiment of the present invention, when classifying the data loaded in the memory 125 into first data and second data, the controller 110 classifies the data such that the first data include unchangeable data, which are not used after entering an idle state, and the second data include variable data, which are used after entering the idle state.

Next, the controller 110 determines whether the apparatus 100 enters an idle state. When the apparatus 100 enters the idle state, the controller 110 divides the memory 125 into a first area 126 and a second area 127.

As used herein, the term "idle state" refers to a state in which a device including a memory does not supply power, or supplies only minimum power, to peripheral device(s) to reduce power consumption in a standby state. After constructing the memory, first data and second data are separately arranged in the first area 126 and the second area 127, respectively. When memory refresh occurs, the controller 110 may control a refresh operation controller 120 to perform a refresh operation in the second area 127 of the memory 125, and not in the first area, thereby retaining data corresponding to the second data stored in the second area 127. In this case, because the refresh operation is not achieved in the first area 126, the first data stored in the first area 126 may be lost.

After performing the refresh operation in the second area 127, the controller 110 determines whether an idle state is released. When the idle state is released, the controller 110 may control the data loader 115 to load the first data stored in the non-volatile storage medium 105 into the memory 125.

As described above, when the apparatus enters an idle state, a refresh operation may be performed. Typically, in an ordinary mode or operation, data are rapidly processed. Additionally, as described herein, a refresh operation may be performed in an idle state for efficiency and to reduce current consumption.

In another exemplary embodiment of the present invention, when dividing the memory 125 into a first area 126 and a second area 127, the controller 110 may check sizes of first data and second data, determine sizes of the first area 126 and the second area 127 corresponding to the sizes of the first data and second data, and control such that the first area 126 and the second area 127 are configured according to the determined sizes.

As mentioned earlier, because the sizes of the first area 126 and the second area 127 are determined depending on the sizes of the first data and the second data, an area in which the refresh operation is performed may be miniaturized to significantly reduce current consumption.

As mentioned above, an apparatus 100 for reducing current consumption will be described in connection with a refresh operation. Hereinafter, a method for reducing current consumption is described in connection with a refresh operation of a memory using the apparatus 100.

Figure 2:
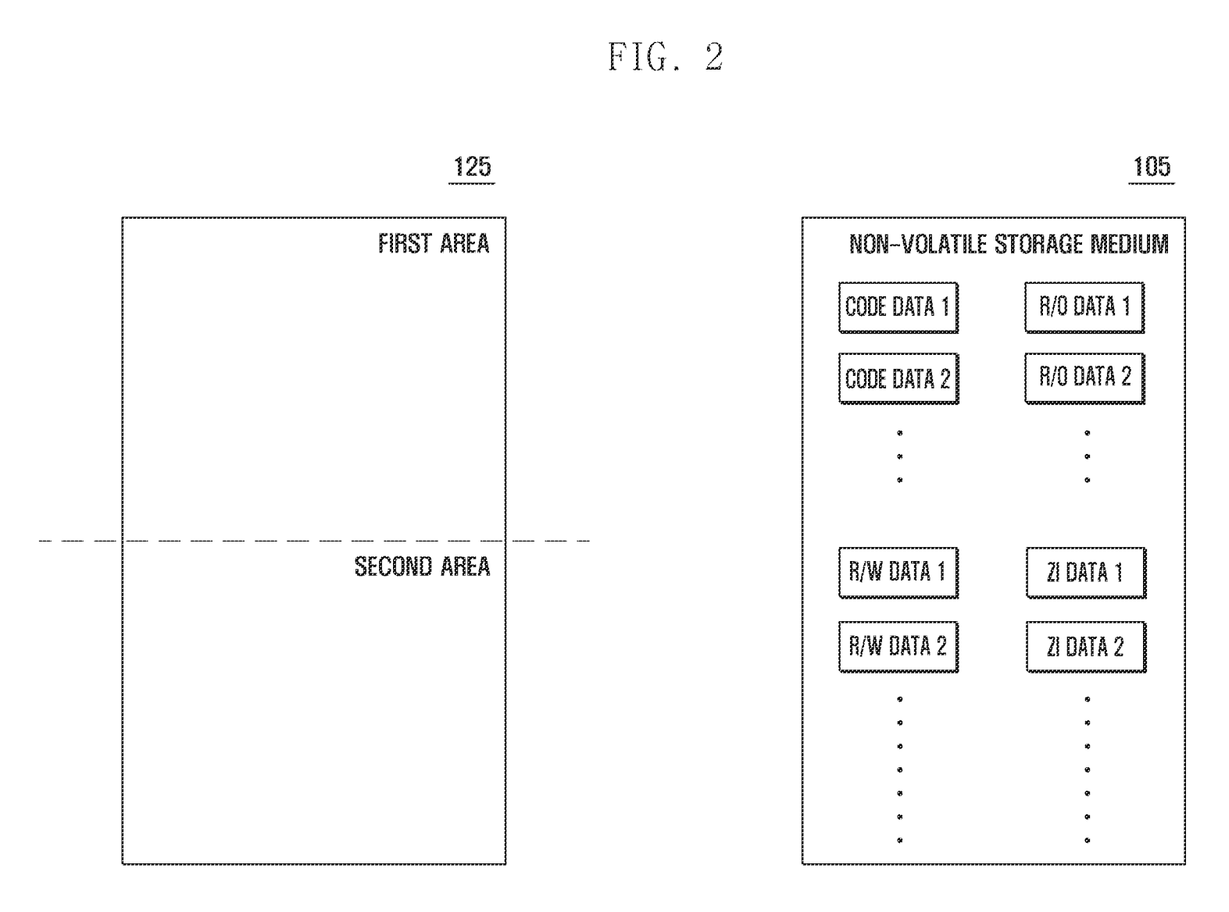
FIG. 2 is a diagram illustrating data arrangement in a memory separated from a non-volatile storage medium according to an exemplary embodiment of the present invention.

FIG. 2 is a diagram illustrating data arrangement in a memory separated from a non-volatile storage medium according to an exemplary embodiment of the present invention.

Referring to FIG. 2, prior to an operation of the apparatus, no data are loaded in the memory 125, and the memory 125 may be divided into a first area and a second area. Stored code data, dedicated read data, read/write data, and 0-initialized data may exist in the non-volatile memory 105.

Figure 3:
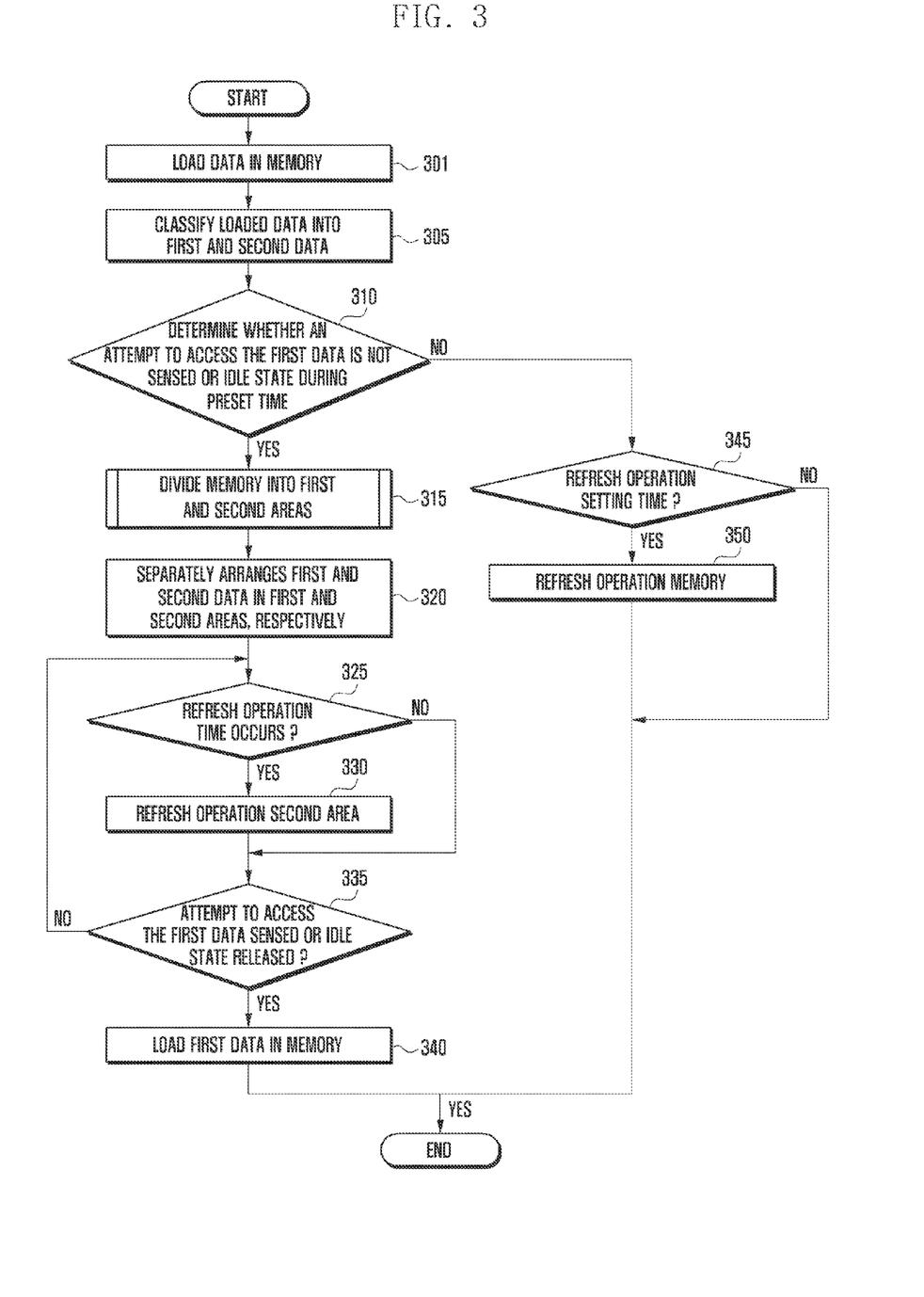
FIG. 3 is a flowchart illustrating a method for reducing current consumption according to an exemplary embodiment of the present invention.

FIG. 3 is a flowchart illustrating a method for reducing current consumption according to an exemplary embodiment of the present invention.

Referring to FIG. 3, a controller 110 loads data in a memory 125 at step 301. After loading the data, the controller 110 may classify the loaded data into first data and second data at step 305. The first data may include unchangeable data which are not used after entering an idle state, and the second data may include variable data which are used after entering the idle state.

Code data or dedicated read data may each be a type of the unchangeable data. The code data are data for executing a program, and the dedicated read data are data which can be read and whose contents cannot be changed. There may be read/write data or 0-initialized data as a type of the variable data. The read/write data are data which are read and whose contents are changed. The 0-initialized data are data whose value is initialized to 0 during execution of a program.

The controller 110 may determine whether an attempt to access the first data is not detected during a preset time at step 310. In another exemplary embodiment of the present invention, the controller 110 may determine whether the apparatus enters an idle state during the preset time at step 310.

As used herein, the term "idle state" refers to a state that does not supply power or supplies minimum power to a peripheral device to reduce current consumption when an apparatus including a memory is in an idle state.

When the attempt to access the first data is detected or the apparatus does not enter an idle state during the preset time, the controller 110 may determine whether a time set for a memory refresh occurs at step 345. When the time set for memory refresh occurs, the controller 110 may perform a refresh operation in all areas of the memory 125 at step 350.

If the time set for a memory refresh does not occur, the controller 110 may terminate the process.

When the controller 110 determines that an attempt to access the first data is not detected or the apparatus enters an idle state during the preset time at step 310, the controller 110 may divide the memory 125 into a first area 126 and a second area 127 at step 315. When the first area 125 and the second area 127 are configured in the memory 125, the controller 110 may separately arrange first data and second data in the first area 126 and the second area 127, respectively at step 320.

After arranging the first and second data, the controller 110 determines whether the time set for a memory refresh has occurred at step 325. When the time set such for a memory refresh occurs, the controller 110 controls the refresh operation controller 120 to perform a refresh operation in only the second area 127 of the memory 125, and excluding the first area 126, thereby retaining data corresponding to the second data stored in the second area 127 at step 330. In this case, because the refresh operation for the first area 126 is not achieved, the first data stored in the first area 126 may be lost. Thereafter, the controller 110 goes to step 335.

If the time set for memory refresh does not occur at step 325, the controller 110 goes to step 335.

The controller 110 determines whether an attempt to access the first data is detected at step 335. In another exemplary embodiment of the present invention, the controller 110 may determine whether an idle state is released at step 335. If the idle state is released, the controller 110 may control the data loader 115 to load the first data stored in the non-volatile storage medium 105 into the memory 125 at step 340. If an attempt to access the first data is not detected or the idle state is not released, the controller 110 may return to step 325 and again determine whether a time set for memory refresh has occurred.

As mentioned above, since a refresh operation may occur in only the second area 127 of the memory 125, current consumption may be reduced as compared with a case in which a refresh operation is performed for all the areas of the memory 125, and accordingly, battery life may be increased. Further, when the first data are accessed, because the first data are loaded from the non-volatile storage medium 105, the problem of data loss may be addressed. Further, when the apparatus 100 enters the idle state, a refresh operation may be performed. Typically, in a normal mode or operation, data are rapidly processed. Additionally, as described herein, a refresh operation may be performed in an idle state for efficiency and to reduce current consumption.

Figure 4:
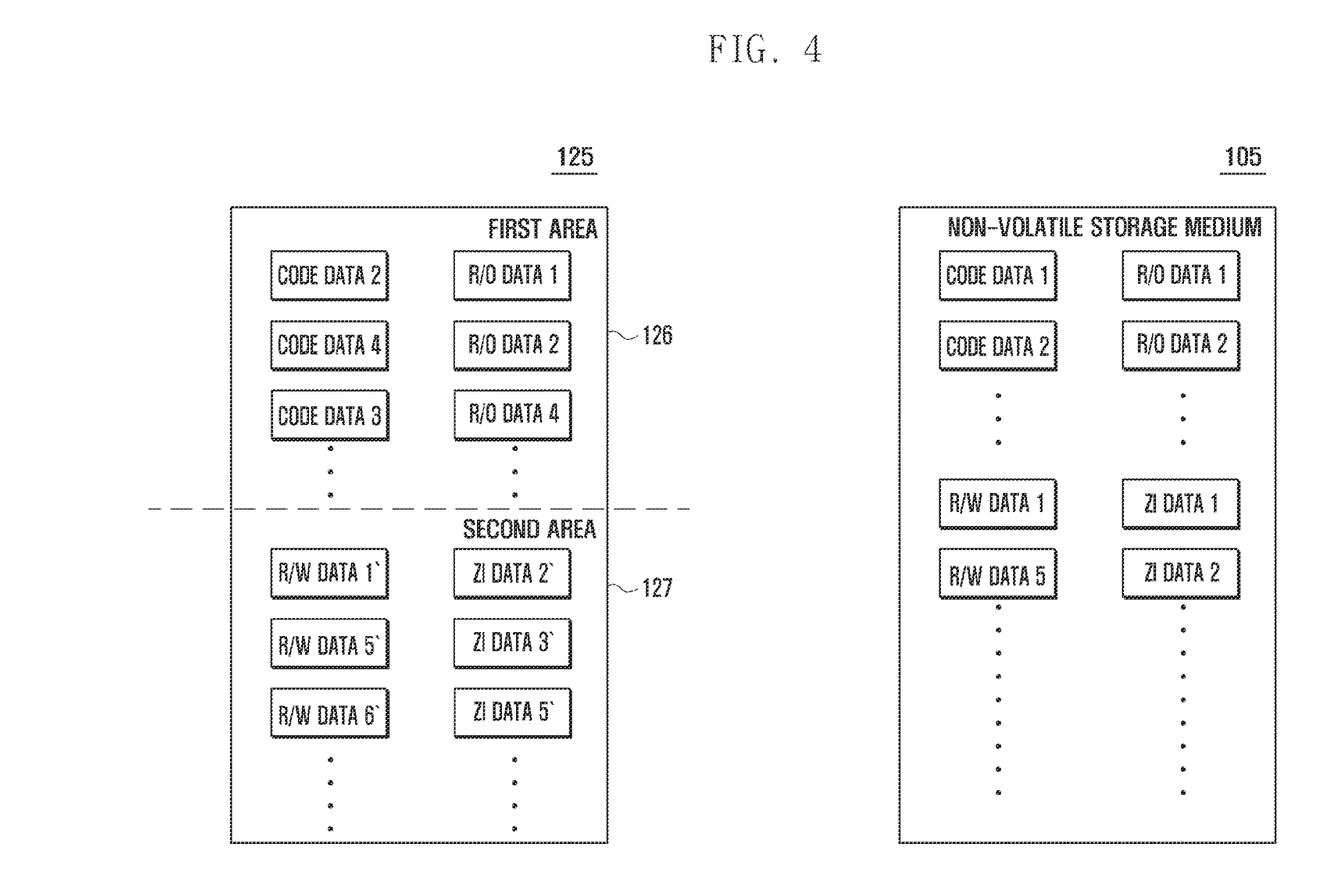
FIG. 4 is a diagram illustrating data arrangement in a memory separated from a non-volatile storage medium according to an exemplary embodiment of the present invention.

FIG. 4 is a diagram illustrating data arrangement in a memory separated from a non-volatile storage medium according to an exemplary embodiment of the present invention.

Referring to FIG. 4, a memory 125 is divided into a first area 126 and a second area 127. Data are loaded in the memory 125. Code data and dedicated read data belonging to unchangeable data are arranged in the first area. Read/write data and 0-initialized data belonging to variable data are arranged in the second area. As the first data, for example, the code data and the dedicated read data, data stored in the non-volatile memory 105 are loaded as-is. However, the second data, for example, the read/write data and the 0-initialized data may be changed and loaded according to a drive of a program (R/W DATA 1→R/W DATA 1', ZI DATA 2→ZI DATA 2').

In the same manner as in FIG. 2, original data may be stored in the non-volatile memory 105 as-is.

Figure 5:
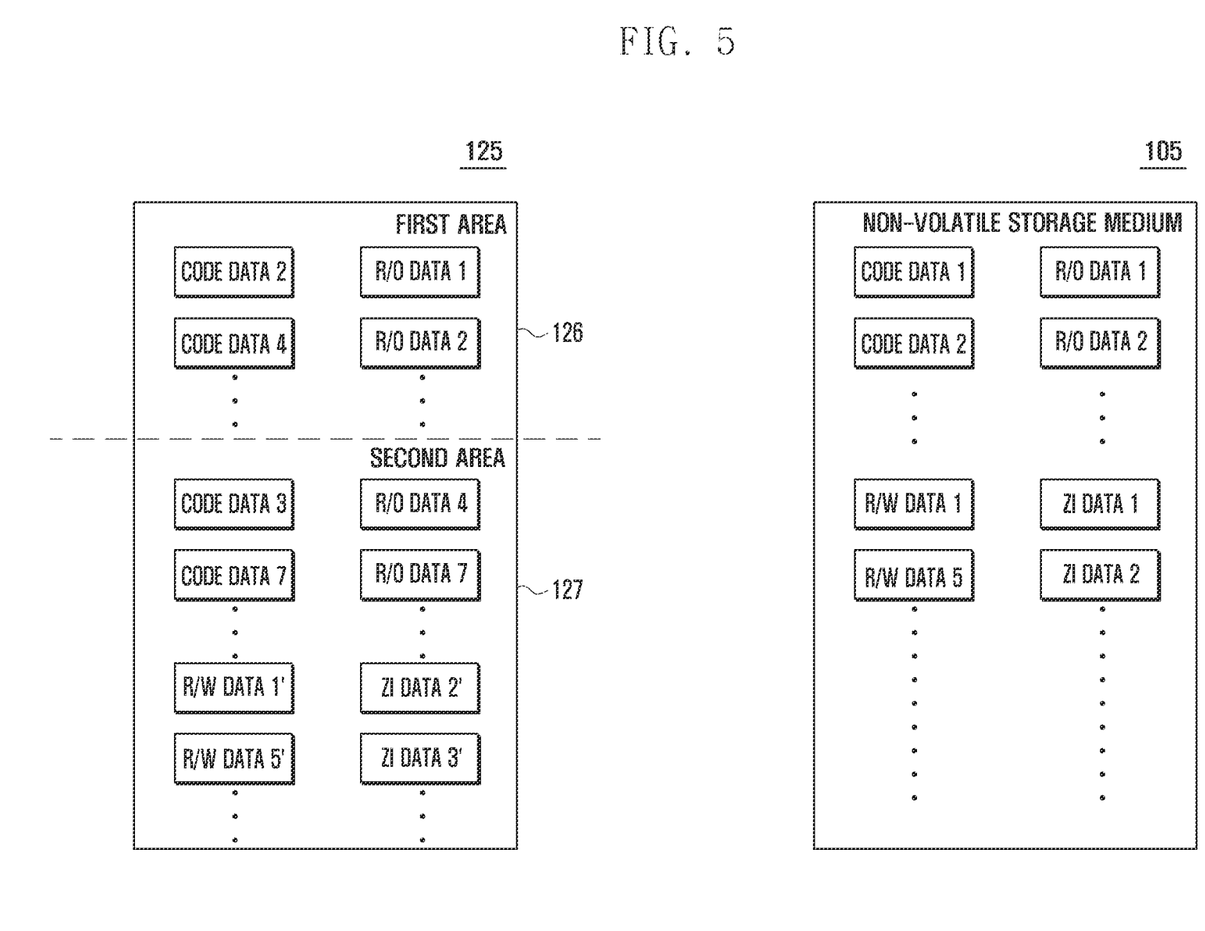
FIG. 5 is a diagram illustrating data arrangement in a memory separated from a non-volatile storage medium according to an exemplary embodiment of the present invention.

FIG. 5 is a diagram illustrating data arrangement in a memory separated from a non-volatile storage medium according to an exemplary embodiment of the present invention.

Referring to FIG. 5, a memory 125 is divided into a first area 126 and a second area 127. Data are loaded in the memory 125. Code data and dedicated read data belonging to unchangeable data which are not used after entering the idle state are arranged in the first area as the first data. Code data, variable data, and dedicated read data, read/write data, and 0-initialized data belonging to variable data which are used after entering the idle state are arranged in the second area.

Unlike the foregoing exemplary embodiment illustrated in FIG. 4, code data and dedicated read data may be loaded in the second area. The code data and the dedicated read data are unchanged data, but are data necessary to maintain the idle state. Data included in the second area and stored in the non-volatile memory 105 are unchanged and loaded as-is. However, the read/write data and the 0-initialized data may be changed and loaded according to a drive of a program (R/W DATA 1→R/W DATA 1', ZI DATA 2→ZI DATA 2').

In the same manner as in FIG. 2, original data may be stored in the non-volatile memory 105 as-is.

Figure 6:
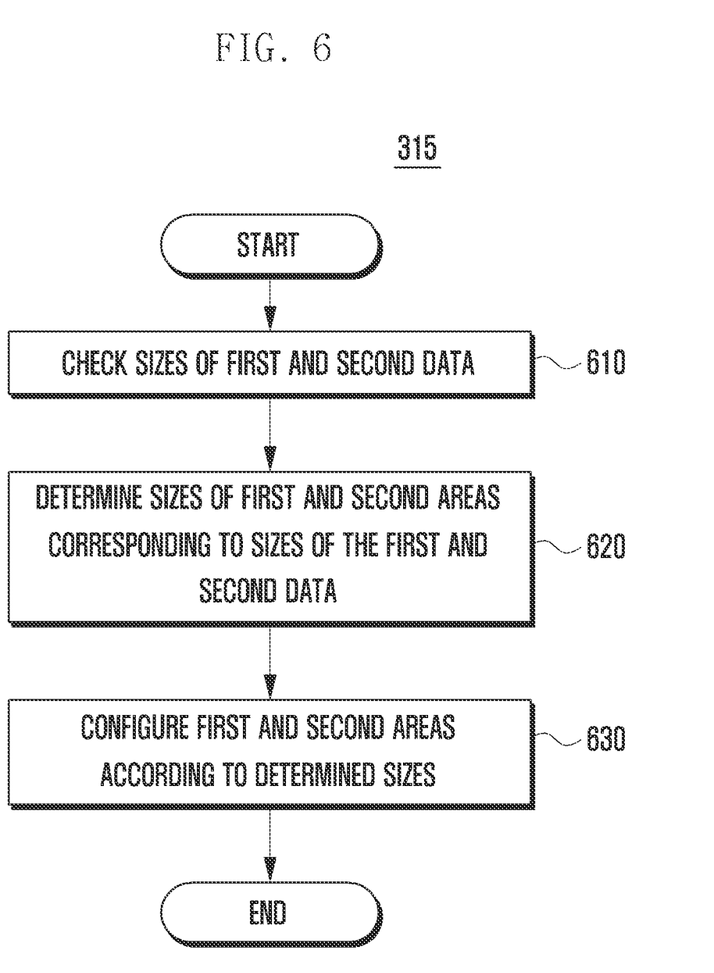
FIG. 6 is a diagram illustrating a method of separating memory according to an exemplary embodiment of the present invention.

FIG. 6 is a diagram illustrating a method of separating a memory according to an exemplary embodiment of the present invention. FIG. 6 specifically illustrates step 315 of FIG. 3.

Referring to FIG. 6, when dividing a memory 125, a controller 110 checks sizes of first data and second data at step 610. Next, the controller 110 determines sizes of a first area 126 and a second area 127 corresponding to the sizes of the first data and the second data, respectively at step 620. Subsequently, the controller 100 controls such that the first area 126 and the second area 127 are configured according to the determined sizes at step 630.

As described above, because the sizes of the first area 126 and the second area 127 are determined according to the sizes of the first data and the second data, an area in which a refresh operation is performed may be miniaturized to reduce current consumption.

Figure 7:
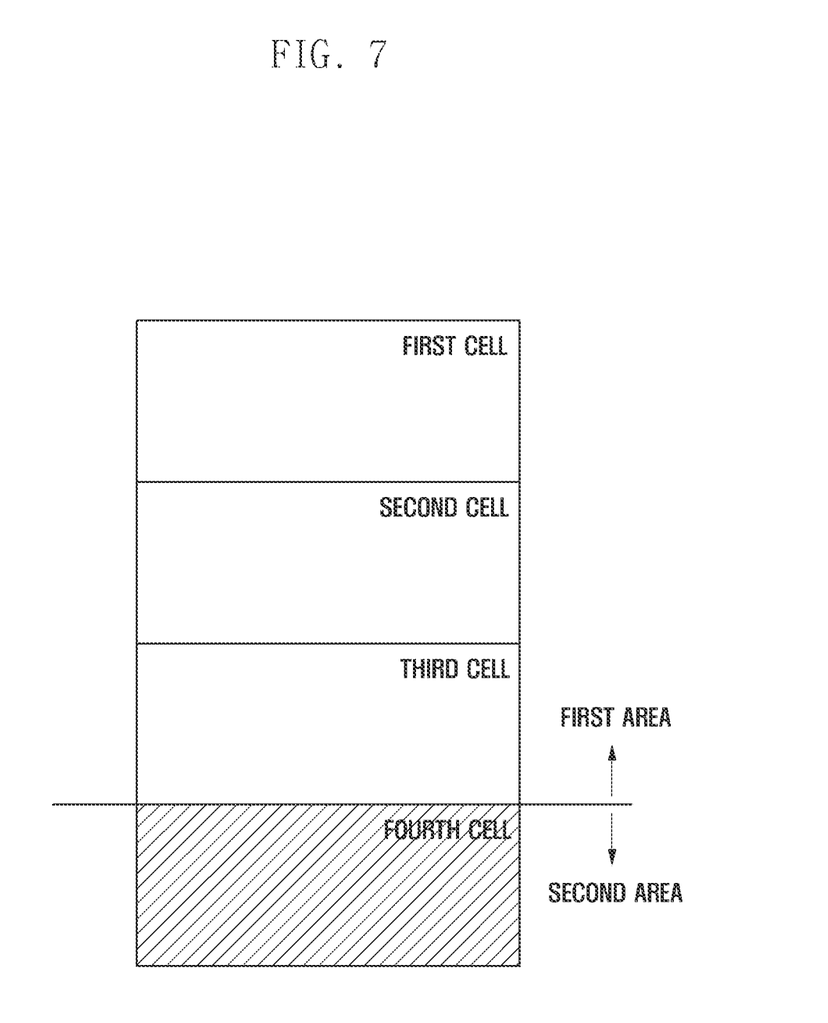
FIG. 7 is a diagram illustrating an internal configuration of the memory according to an exemplary embodiment of the present invention.

FIG. 7 is a diagram illustrating an internal configuration of the memory according to an exemplary embodiment of the present invention. FIG. 7 illustrates internal cells constituting a real memory, and a memory in which a refresh operation can be partially performed.

Referring to FIG. 7, a memory 125 has four cells. A refresh operation may be performed in each cell. Accordingly, one cell is required as the minimum unit of the refresh operation. When arranging the first data and the second data, the controller 110 firstly arranges the second data, and then arranges the first data in a cell in which the second data are not arranged.

When refreshing the memory 125, only the second area in which the second data are arranged is refreshed. As illustrated in FIG. 7, current consumption in a case in which only one cell is configured as the second area may be reduced by ¾ as compared with a case in which entire areas of the memory 125 refresh.

In exemplary embodiments of the present invention, a refresh operation occurring in only a partial area of a memory is performed in order to reduce current consumption necessary for refresh, thereby reducing overall current consumption and increasing the lifetime of a battery.

While the invention has been shown and described with reference to certain exemplary embodiments thereof, it will be clearly understood by those skilled in the art that various changes in form and details may be made therein without departing from the spirit and scope of the present invention as defined in the appended claims and their equivalents.

What is claimed is:

1. A method for reducing current consumption by employing a memory refresh operation in an apparatus including a memory in which a partial refresh operation is performed, the method comprising:

classifying data loaded in the memory into first data and second data;

dividing the memory into a first area and a second area when an attempt to access the first data is not detected during a preset time;

separately arranging the first data and the second data in the first area and the second area, respectively;

performing a refresh operation in the second area at the preset time in order to retain data; and loading the first data into the memory when the attempt to access the first data is detected.

2. The method of claim 1, wherein the first data are unchangeable data, and the second data are variable data.

3. The method of claim 2, wherein the first data comprises at least one of code data or dedicated read data.

4. The method of claim 3, wherein the second data comprises at least one of read/write data or 0-initialized data.

5. The method of claim 4, further comprising entering an idle state when the attempt to access the first data is detected during the preset time.

6. The method of claim 5, further comprising releasing the idle state when the attempt to access the first data is detected.

7. The method of claim 6, wherein the first data comprises unchangeable data which are not used after the entering of the idle state, and the second data comprises variable data and unchangeable data which are used after the idle state has been entered.

8. The method of claim 1, wherein the dividing of the memory comprises:
   checking sizes of the first data and the second data; and
   determining sizes of the first area and the second area of the memory corresponding to the respective sizes of the first data and the second data.

9. The method of claim 1, wherein the preset time is set by a user of the apparatus.

10. The method of claim 1, wherein the preset time is set by the manufacturer of the apparatus.

11. An apparatus for reducing current consumption, the apparatus comprising:
    a non-volatile storage medium that does not require a refresh operation;
    a memory in which the refresh operation is partially performed;
    a power unit for supplying power to the memory;
    a controller for classifying data loaded in the memory into first data and second data, for dividing the memory into a first area and a second area when an attempt to access the first data is not detected during a preset time, and for controlling such that the first data and the second data are separately arranged in the first area and the second area, respectively;
    a refresh operation controller for controlling such that a refresh operation in the second area is performed to retain data; and
    a data loader for loading the first data stored in the non-volatile storage medium into the memory when the controller detects the attempt to access the first data.

12. The apparatus of claim 11, wherein the first data are unchangeable data, and the second data are variable data.

13. The apparatus of claim 12, wherein the first data comprises at least one of code data or dedicated read data.

14. The apparatus of claim 13, wherein the second data comprises at least one of read/write data or 0-initialized data.

15. The apparatus of claim 14, wherein the controller enters an idle state when the attempt to access the first data is detected during the preset time.

16. The apparatus of claim 15, wherein the controller releases the idle state when the attempt to access the first data is detected.

17. The apparatus of claim 16, wherein the first data comprises unchangeable data which are not used after the idle state has been entered, and the second data comprises variable data and unchangeable data which are used after the idle state has been entered.

18. The apparatus of claim 11, wherein the controller checks sizes of the first data and the second data when dividing the memory, and determines sizes of the first area and the second area of the memory corresponding to the respective sizes of the first data and the second data.

19. The apparatus of claim 11, wherein the preset time is set by a user of the apparatus.

20. The apparatus of claim 11, wherein the preset time is set by the manufacturer of the apparatus.

* * * * *